US008820863B2

(12) United States Patent
Chen et al.

(10) Patent No.: US 8,820,863 B2
(45) Date of Patent: Sep. 2, 2014

(54) SUPPORT DEVICE FOR BRACKET AND RAIL OF SLIDE ASSEMBLY

(75) Inventors: Ken-Ching Chen, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 209 days.

(21) Appl. No.: 13/334,176

(22) Filed: Dec. 22, 2011

(65) Prior Publication Data
US 2013/0161468 A1 Jun. 27, 2013

(51) Int. Cl.
*A47B 88/00* (2006.01)

(52) U.S. Cl.
USPC ..................................... 312/334.5; 312/334.8

(58) Field of Classification Search
USPC .................. 248/298.1; 108/143, 137, 102; 312/330.1, 334.1, 334.5, 249.11, 312/249.4, 334.4, 334.7, 334.8, 334.11, 312/223.1; 211/26
See application file for complete search history.

(56) References Cited

U.S. PATENT DOCUMENTS

| 2,658,241 | A | * | 11/1953 | Houghton, Jr. | 52/632 |
| 3,104,087 | A | * | 9/1963 | Budnick et al. | 248/343 |
| 3,162,413 | A | * | 12/1964 | Hexdall | 248/71 |
| 4,469,384 | A | * | 9/1984 | Fler et al. | 312/333 |
| 6,076,788 | A | * | 6/2000 | Akiyama | 248/200.1 |
| 6,739,682 | B2 | * | 5/2004 | Shih | 312/334.4 |
| 7,188,916 | B2 | | 3/2007 | Silvestro et al. | |
| 7,909,420 | B2 | * | 3/2011 | Jahrling | 312/228.1 |
| 2006/0152115 | A1 | | 7/2006 | Dubon et al. | |
| 2008/0036347 | A1 | | 2/2008 | Liang | |
| 2008/0111456 | A1 | * | 5/2008 | Huang | 312/334.5 |
| 2009/0283652 | A1 | * | 11/2009 | Chen et al. | 248/298.1 |

* cited by examiner

*Primary Examiner* — Alfred J Wujciak
(74) *Attorney, Agent, or Firm* — Rosenberg, Klein & Lee

(57) ABSTRACT

A slide assembly includes a bracket having two support portions and a side portion which extends between the support portions. A path is defined by the side portion and the support portions. Each support portion has a protrusion extending toward the path and the protrusion has a supporting face. A rail is longitudinally connected to the path of the bracket and has two outer walls and a side wall. The outer walls are located adjacent to the support portions and the side wall extends between the outer walls and is located adjacent to the side portion. Each of outer walls has a protruding portion which has a contact face and the contact face is located corresponding to the supporting face. When the outer walls move relative to the support portions, the contact face of the protruding portion contacts the supporting face of the protrusion.

7 Claims, 5 Drawing Sheets

SUPPORT DEVICE FOR BRACKET AND RAIL OF SLIDE ASSEMBLY

FIELD OF THE INVENTION

The present invention relates to a support device, and more particularly, to a more reliable support device for bracket and rails of a slide assembly.

BACKGROUND OF THE INVENTION

Conventional support devices for bracket and rails of a slide assembly are disclosed in U.S. Pat. No. 7,188,916 with the title of "Adjustable side rails and method of attaching same to mounting rails of cabinet racks" to Silverstro, U.S. Publication No. 2006/0152115 with the title of "Adjustable reinforcing bracket for telescoping slide rail assembly" to Dubon, and U.S. Publication No. 2008/0036347 with the title of "Rail device for extracting computer equipment" to Liang, all of which are provided for reference.

Generally, the slide assembly comprises multiple rails, a front bracket and a rear bracket respectively located at the front end and the rear end of the slide assembly, wherein the rear bracket is usually movably connected to the slide assembly so as to adjust the length of the combination thereof. When the slide assembly with the brackets is used to a rack system, the front and rear brackets are connected to the rack, a server is connected to the slide assembly and a cable management arm is connected to the rear end of the slide assembly so as to manage the cables of the server. Because the cable management arm supports the cables so that their weight is significant and once the rear end of the slide assembly relative to the rear bracket cannot bear the weight of the cable management arm and the cables, the rails tends to be dragged downward or twisted relative to the rear bracket, and this affects the stability of support for the whole slide assembly.

A solution is needed to improve the shortcomings mentioned above.

The present invention intends to provide a reliable support device for bracket and rails of a slide assembly.

SUMMARY OF THE INVENTION

The present invention relates to a support device for a slide assembly and comprises a bracket having a pair of support portions and a side portion which extends between the pair of the support portions. A path is defined by the side portion and the pair of the support portions. A rail is longitudinally connected to the path of the bracket and has a pair of outer walls and a side wall. The outer walls are located adjacent to the pair of the support portions of the bracket. The side wall extends between the pair of the outer walls and is located adjacent to the side portion of the bracket. Each of the pair of the support portions has a first support section extending from the side portion, a second support section bending from the first support section, and at least one first protrusion extending toward the path. The at least one first protrusion has a supporting face. Each of the pair of the outer walls has a first bent section extending from the side wall, a second bent section extending from the first bent section, and at least one protruding portion which has a contact face which is located corresponding to the supporting face. When the pair of the outer walls of the rail move relative to the pair of the support portions of the bracket, the contact face of the at least one protruding portion contacts the supporting face of the first protrusion.

Preferably, the second support section has a holding face which faces the path. The second support section is located adjacent to the second bent section. The first bent section has a first bent face which faces the path. The second bent section has a second bent face which faces the holding face of the second support section.

Preferably, the at least one first protruding portion is formed integrally with the holding face of the second support section by pressing and protrudes into the path.

Preferably, the at least one protruding portion is formed integrally with the first bent section of one of the outer walls by pressing and protrudes from the first bent face.

Preferably, a pair of extension sections extend from the two second bent sections and toward each other. The extension sections are substantially parallel to the side wall.

Preferably, the first protrusion is formed with a bent portion of the second support section and protrudes and reaches to the path. A second protrusion is located to the first support section and the second protrusion extends toward the at least one protruding portion of the rail and contacts the at least one protruding portion.

Preferably, the first protrusion is substantially perpendicular to and connected to the second protrusion.

The present invention further relates to a slide assembly and comprises a pair of outer walls and each of the outer walls has at least one protruding portion. Each of the outer walls has a first bent section and a second bent section extends from the first bent section. A side wall extends between the two outer walls and both of the side wall and the two outer walls have a longitudinal length. The at least one protruding portion has a contact face and the first bent section extends from the side wall. The first bent section has a first bent face and the second bent section has a second bent face. The at least one protruding portion protrudes beyond the first bent face and the contact face is located adjacent to the second bent face.

Preferably, the at least one protruding portion is formed integrally with the first bent section of one of the outer walls by pressing, and protrudes from the first bent face which is substantially parallel to the side wall.

Preferably, a pair of extension sections extend from the two second bent sections and toward each other. The extension sections are substantially parallel to the side wall.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
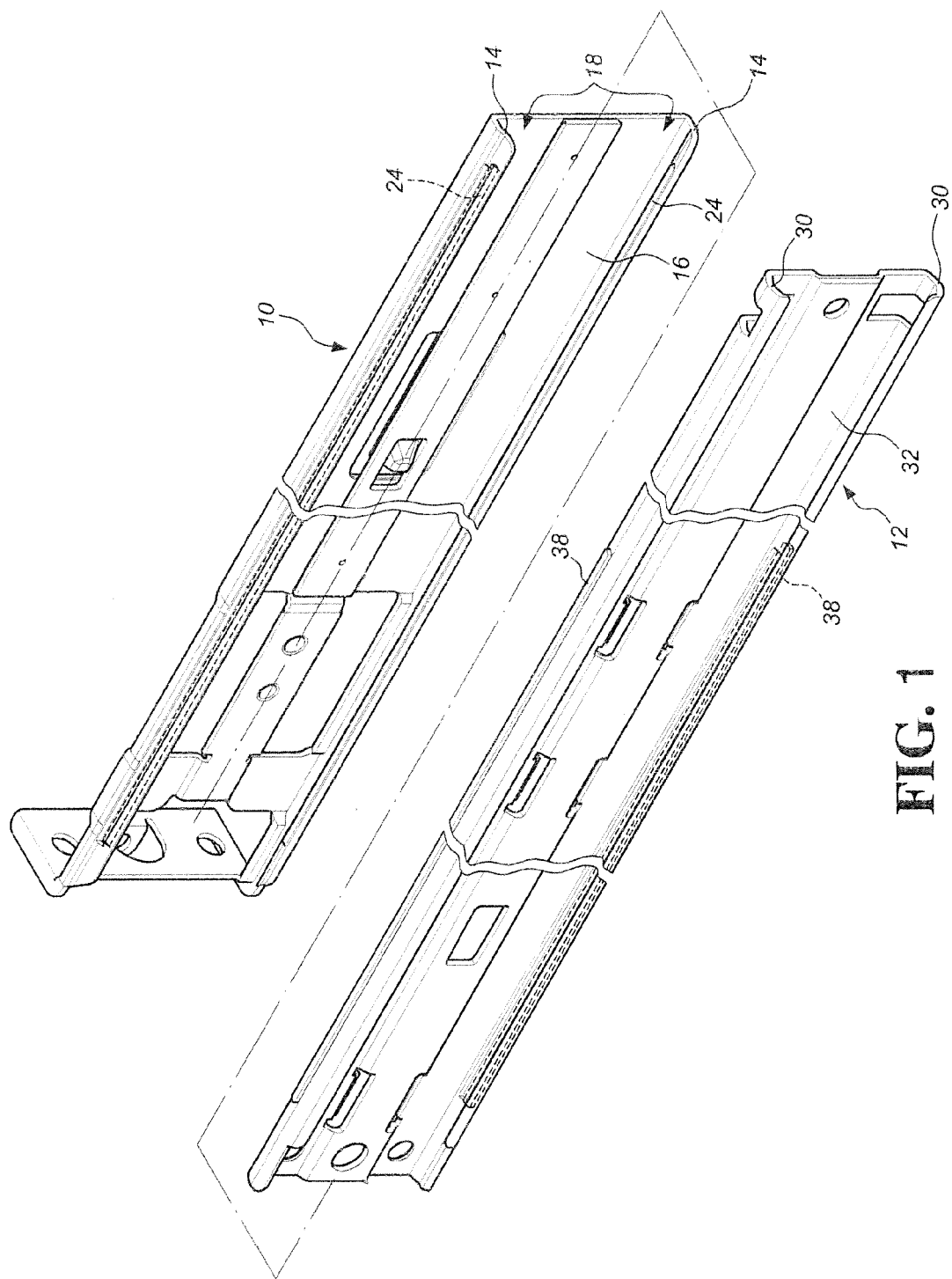
FIG. 1 is an exploded view to show the support device for a bracket and a rail of a slide assembly of the present invention.
Figure 2:
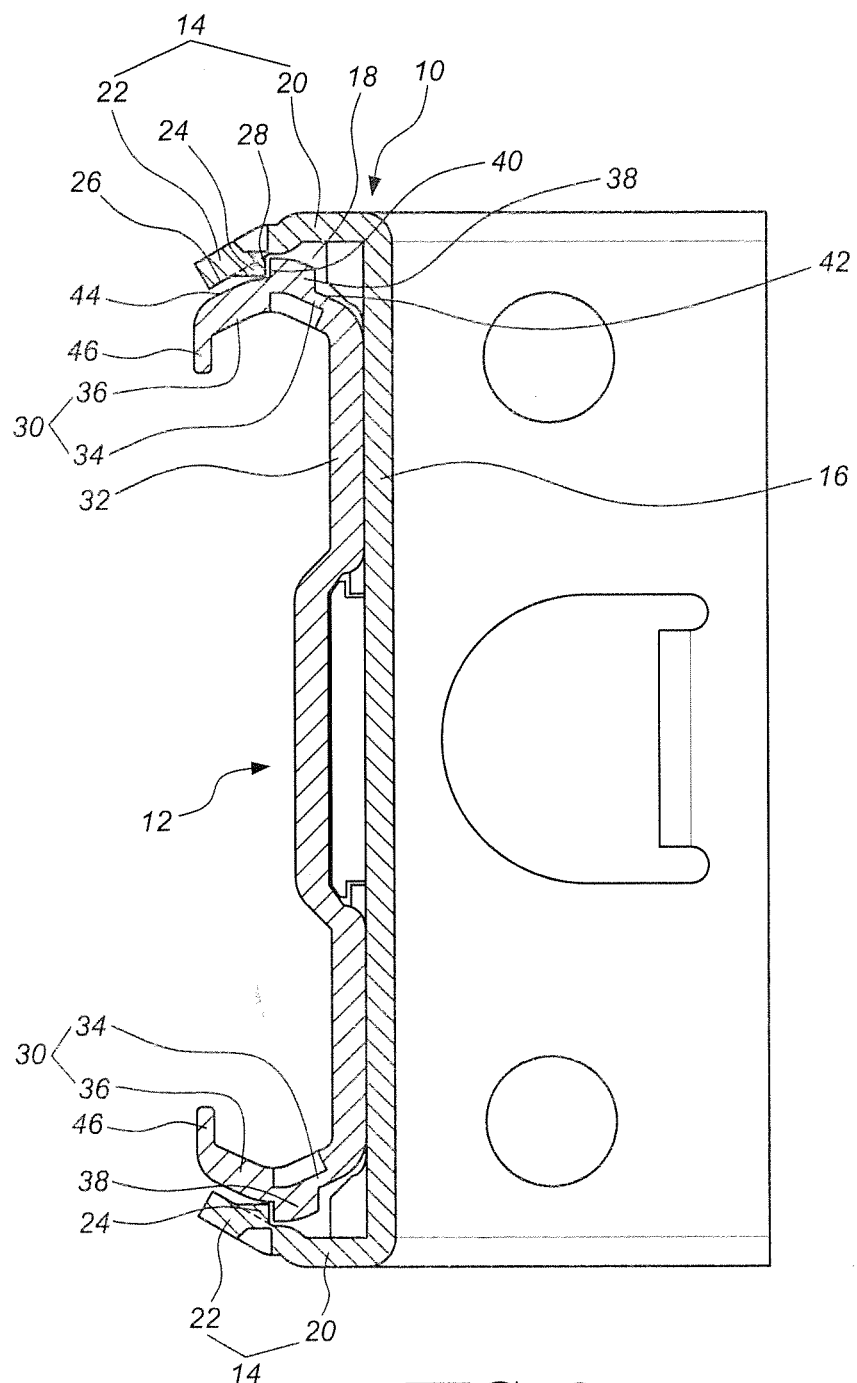
FIG. 2 is a cross sectional view of the support device for a bracket and a rail of a slide assembly of the present invention.

Referring to FIGS. 1 and 2, the support device for a bracket 10 and a rail 12 of a slide assembly of the present invention, the bracket 10 has a pair of support portions 14 and a side portion 16, wherein the side portion 16 extends between the pair of the support portions 14. A path 18 is defined by the side portion 16 and the pair of the support portions 14. In this embodiment, each of the pair of the support portions 14 has a first support section 20 extending from the side portion 16, a second support section 22 extending from the first support section 20, and a first protrusion 24 extending toward the path 18. The second support section 22 has a holding face 26 which faces the path 18, and the first protrusion 24 has a supporting face 28. Preferably, the first protruding 24 is formed integrally with the holding face 26 of the second support section 22 by pressing and protrudes into the path 18.

The rail 12 is longitudinally connected to the path 18 of the bracket 10 and comprises a pair of outer walls 30 and a side wall 32. The pair of the outer walls 30 are located adjacent to the pair of the support portions 14 of the bracket 10. The side wall 32 extends between the pair of the outer walls 30. The side wall 32 is located adjacent to the side portion 16 of the bracket 10. In this embodiment, each of the pair of the outer walls 30 has a first bent section 34 extending from the side wall 32, a second bent section 36 extending from the first bent section 34, and a protruding portion 38 located on outside one of the outer walls 30. The protruding portion 38 has a contact face 40 which is located corresponding to the supporting face 28 of the first protrusion 24. The contact face 40 faces the supporting face 28. The second support section 22 is located adjacent to the second bent section 36. The first bent section 34 has a first bent face 42 which faces the path 18. The second bent section 36 has a second bent face 44 which faces the holding face 26 of the second support section 22. Preferably, the contact face 40 of the protruding portion 38 is located adjacent to the second bent face 44 and the contact face 40 is substantially parallel to the side wall 32.

In one preferable embodiment, the protruding portion 38 is formed integrally with the first bent section 34 of one of the outer walls 30 by pressing and protrudes from the first bent face 42.

In one preferable embodiment, the present invention further comprises a pair of extension sections 46 which extend from the two second bent sections 36 and toward each other. The pair of the extension sections 46 are substantially parallel to the side wall 32.

In one preferable embodiment, the second support section 22 is bent from the first support section 20 and is located adjacent to the second bent section 36 of the rail 12.

Figure 3:
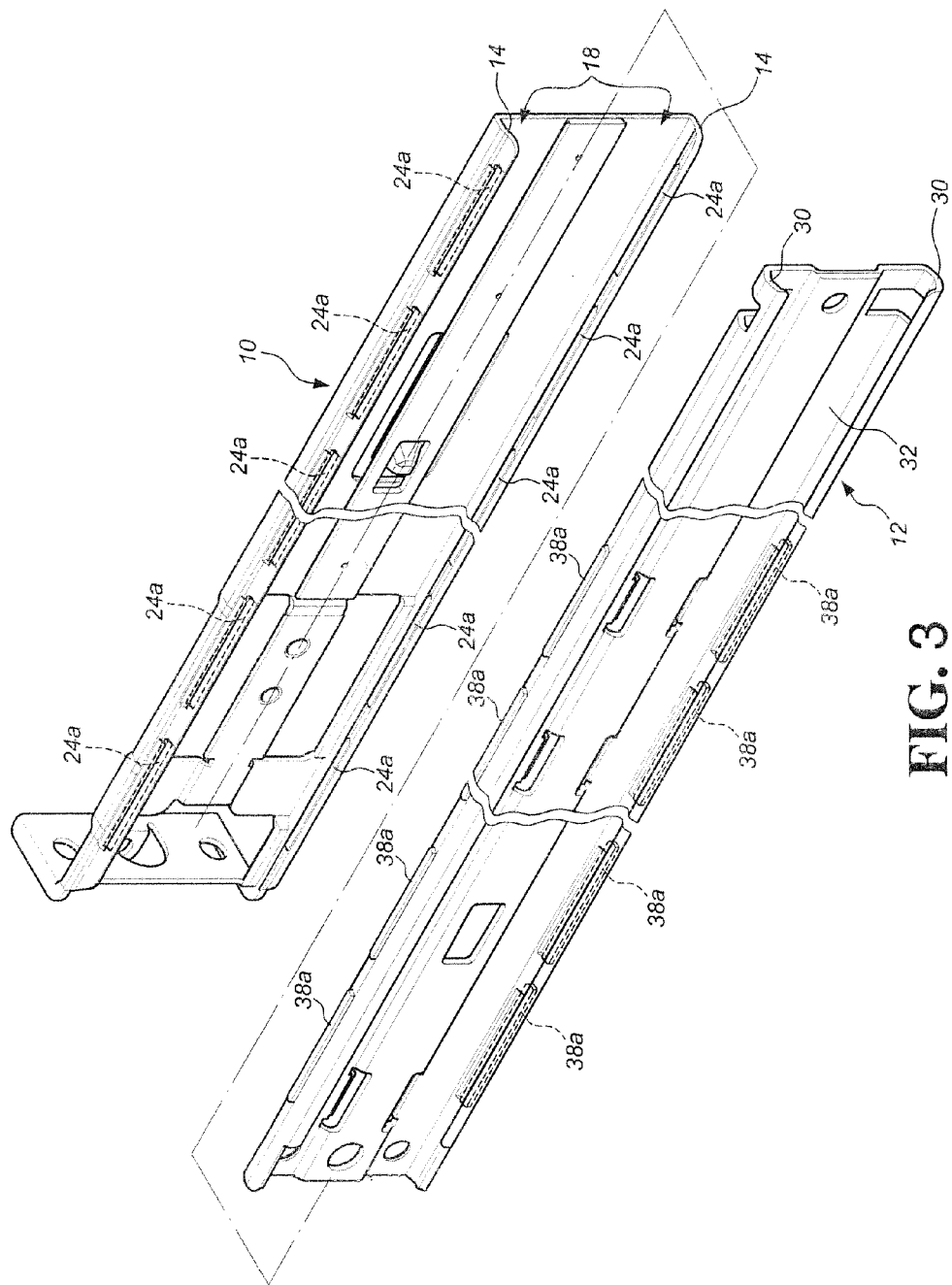
FIG. 3 shows that the support device for a bracket and a rail of a slide assembly of the present invention has multiple first protrusions and protruding portions.

In one preferable embodiment, as shown in FIG. 3, the bracket 10 has a longitudinal length and each of the support portions 14 of the bracket 10 has multiple first protrusions 24a which face the path 18. The side wall 32 of the rail 12 and the pair of the outer walls 30 have a longitudinal length and each of the pair of the outer walls 30 of the rail 12 has multiple protruding portions 38a.

Figure 4:
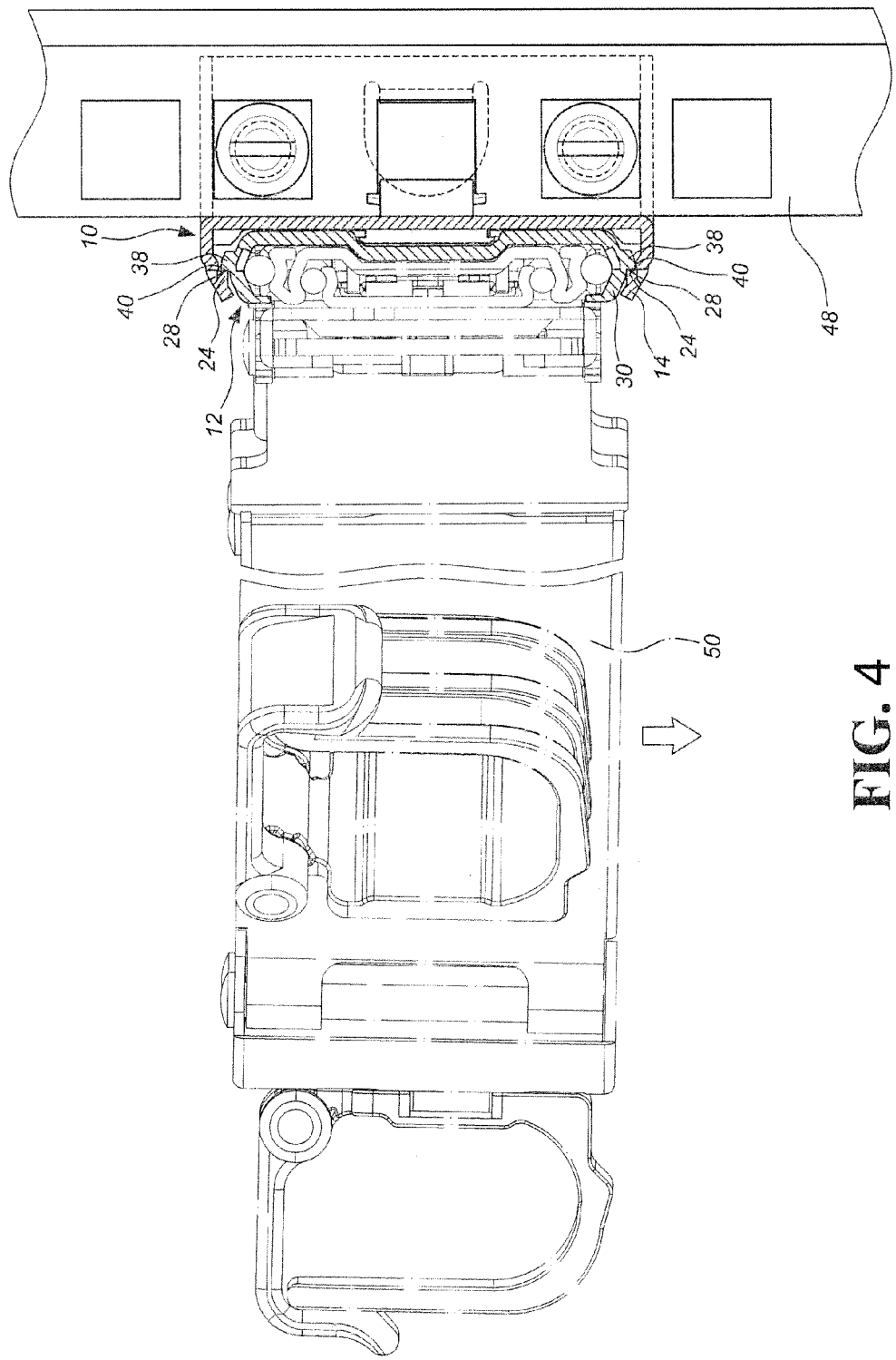
FIG. 4 shows that the support device for bracket and rails of a slide assembly of the present invention is applied by a load.

FIG. 4 shows that the bracket 10 is installed to a rack 48 and multiple rails 12 are provided so that a cable management arm 50 is connected thereto. According to the arrangement of the present invention, when the weight of the cable management arm 50 is applied to the rails 12 which are deformed or twisted relative to the bracket 10, the pair of the outer walls 30 of the rail 12 move relative to the pair of the support portions 14 of the bracket 10, and the contact face 40 of the protruding portion 38 contacts the supporting face 28 of the first protrusion 24 to ensure that the rail 12 does not drop from the bracket 10.

Figure 5:
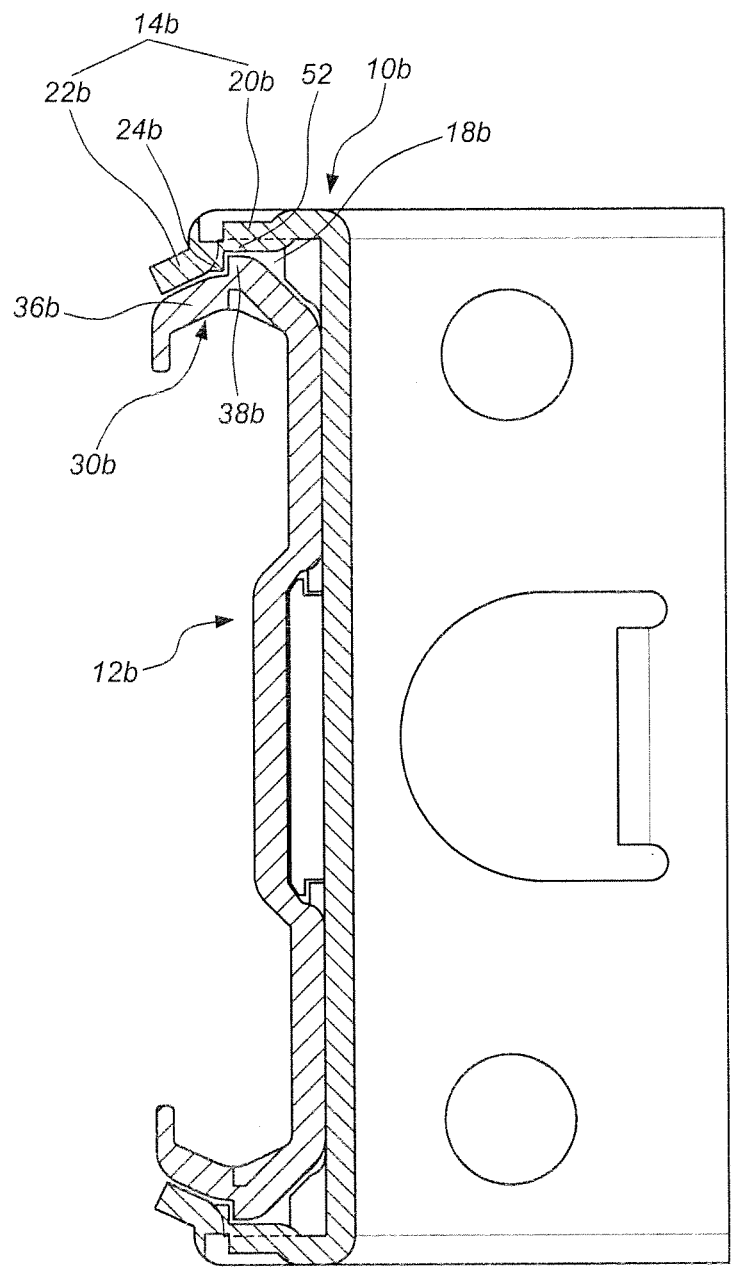
FIG. 5 is a cross sectional view to show another embodiment of the support device for a bracket and a rail of a slide assembly of the present invention.

In another embodiment, as shown in FIG. 5, the first protrusion 24b is formed with a bent portion of the second support section 22b and protrudes into the path 18b. Each of the support portions 14b has at least one second protrusion 52 located to the first support section 20b and extending toward the protruding portion 38b of the rail 12b, and the second protrusion 52 may contact the protruding portion 38. Preferably, the first protrusion 24b is substantially perpendicular to and connected to the second protrusion 52. When the outer walls 30b of the rail 12b move relative to the support portions 14b of the bracket 10b, the second bent section 36b of the rail 12b contacts the second support section 22b of the bracket 10 to reinforce the support from the bracket 10b to the rail 12b.

While we have shown and described the embodiment in accordance with the present invention, it should be clear to those skilled in the art that further embodiments may be made without departing from the scope of the present invention.

What is claimed is:

1. A support device for a slide assembly in a rack system, comprising:
   a bracket having a pair of support portions and a side portion, the side portion extending between the pair of the support portions, a path defined by the side portion and the pair of the support portions, the support portions each projecting transversely from the side portion to define a terminal edge;
   a rail engaging the bracket to extend longitudinally along the path thereof, the rail having a pair of outer walls and a side wall, the pair of the outer walls located adjacent to the pair of the support portions of the bracket, the side wall extending between the pair of the outer walls, the side wall located adjacent to the side portion of the bracket, the outer walls each projecting transversely from the side wall;
   wherein each of the support portions includes a first support section extending from the side portion, a second support section bending from the first support section, and at least one first protrusion extending toward the path, the at least one first protrusion having a supporting face;
   wherein each of the outer walls includes a first bent section extending from the side wall, a second bent section extending from the first bent section and at least one protruding portion, the at least one protruding portion having a contact face located corresponding to the supporting face;
   wherein when the pair of the outer walls of the rail move relative to the pair of the support portions of the bracket, the contact face of the at least one protruding portion contacts the supporting face of the at least one first protrusion to retain the outer walls laterally within the terminal edges of the support portions.

2. The device as claimed in claim 1, wherein the second support section has a holding face which faces the path, the second support section is located adjacent to the second bent section, the first bent section has a first bent face which faces the path, the second bent section has a second bent face which faces the holding face of the second support section.

3. The device as claimed in claim 2, wherein the at least one first protruding portion is formed integrally with the holding face of the second support section by pressing and protrudes into the path.

4. The device as claimed in claim 2, wherein the at least one protruding portion is formed integrally with the first bent section of one of the outer walls by pressing and protrudes from the first bent face.

5. The device as claimed in claim 2 further comprising a pair of extension sections which extend from the two second bent sections and toward each other, the extension sections are substantially parallel to the side wall.

6. The device as claimed in claim 2, wherein the at least one first protrusion is formed with a bent portion of the second support section and protrudes and reaches to the path, a second protrusion is located to the first support section, the second protrusion extends toward the at least one protruding portion of the rail and contacts the at least one protruding portion.

7. The device as claimed in claim 6, wherein the at least one first protrusion is substantially perpendicular to and connected to the second protrusion.

\* \* \* \* \*